United States Patent [19]

Nakaya et al.

[11] Patent Number: 5,502,384
[45] Date of Patent: Mar. 26, 1996

[54] IMAGE RECONSTRUCTION METHOD IN NUCLEAR MAGNETIC RESONANCE IMAGING APPARATUS

[75] Inventors: Chitose Nakaya, Tokyo; Yoshitaka Bito, Kokubunji; Etsuji Yamamoto, Akishima; Hiroshi Nishimura; Hiroyuki Takeuchi, both of Kashiwa; Shigeru Watanabe, Ibaraki; Akihiro Miyajima; Hitoshi Arai, both of Kashiwa, all of Japan

[73] Assignees: Hitachi, Ltd.; Hitachi Medical Corporation, both of Tokyo, Japan

[21] Appl. No.: 243,907

[22] Filed: May 17, 1994

[30] Foreign Application Priority Data

May 24, 1993 [JP] Japan .................................. 5-121120

[51] Int. Cl.$^6$ .................................................. G01R 33/20
[52] U.S. Cl. .......................................... 324/309; 324/307
[58] Field of Search ................................ 324/307, 309, 324/300; 128/653.2

[56] References Cited

U.S. PATENT DOCUMENTS

| | | | |
|---|---|---|---|
| 4,780,675 | 10/1988 | DeMeester et al. | 329/309 |
| 4,833,407 | 5/1989 | Holland et al. | 324/309 |
| 4,851,779 | 7/1989 | DeMeester et al. | 324/309 |
| 4,912,413 | 3/1990 | DeMeester et al. | 324/309 |
| 5,043,665 | 8/1991 | Kuhara et al. | 324/309 |
| 5,268,640 | 12/1993 | Du et al. | 324/309 |
| 5,270,654 | 12/1993 | Feinberg et al. | 324/307 |
| 5,341,099 | 8/1994 | Suzuki | 324/309 |

FOREIGN PATENT DOCUMENTS 0628747  4/1985  Japan .

OTHER PUBLICATIONS

"NMR Medicine" pp. 129–130, 134–138, (1991).
"MRI Explained with drawings" pp. 145–147 (Apr. 1989).
The Journal of the Inst. of Electronics, Info. and Comm. Engineers vol. 571–D pp. 182–187 (1988).
Autumn National Convention Record of the IEIEC 1992, D–88 P. 6–88.
Journal of Society of Control Engineers vol. 30, No. 9, 1991 9, pp. 818–827.

Primary Examiner—Sandra L. O'Shea
Assistant Examiner—Raymond Y. Mah
Attorney, Agent, or Firm—Antonelli, Terry, Stout & Kraus

[57] ABSTRACT

In an image reconstruction method in a nuclear magnetic resonance imaging apparatus, the method comprises first and second steps to get detected data $S_I$ for at least about half of region inclusive of an origin and data $S_{IV}$ in a region symmetric with respect to a line passing through an origin on one of axes from the detected region in the acquired data space and parallel to the other axis, respectively, third and fourth steps to perform inverse Fourier transform on the data $S_I$ and $S_{IV}$, respectively, a fifth step to get a complex conjugate value of the result obtained from Step 3, a sixth step to get a complex conjugate value of the result obtained from Step 4, a seventh step to calculate a phase map from the results obtained from the second, third, fourth, fifth and sixth steps, an eighth step to multiply the result obtained from step 6 by the phase map obtained from step 7 and to obtain a phase corrected data, and a ninth step to sum the result obtained from the third step and the result obtained from the eighth step. The method can thus obtain the whole reconstructed image.

12 Claims, 6 Drawing Sheets

FREQUENCY ENCODE DIRECTION

FREQUENCY ENCODE DIRECTION

IMAGE RECONSTRUCTION METHOD IN NUCLEAR MAGNETIC RESONANCE IMAGING APPARATUS

BACKGROUND OF THE INVENTION

This invention relates to a nuclear magnetic resonance imaging (hereinafter referred to as the "MRI") apparatus for measuring nuclear magnetic resonance (hereinafter referred to as the "NMR") signals from hydrogen, phosphorus, etc., in an object under inspection and imaging a distribution of a nuclear spin density, a distribution of the time of relaxation, etc., and to an image reconstruction method in the nuclear magnetic resonance imaging apparatus for reconstructing and imaging detected data of MRI.

MRI is a method which determines a spatial distribution of NMR parameters by encoding position data to the NMR signals and displaying it as an image, and it is known that a reconstructed image can be obtained by performing Fourier transform on the detected data in MRI ("NMR in Medicine", pp. 129–130, Maruzen (1991) and "Illustrative MRI", pp. 145–147, Shujunsha (1991)). In MRI, the NMR signal is measured at each discrete point of an acquired data space (which is called a "Fourier space" or a "k space") having a phase encode direction and a frequency encode direction as coordinates axes thereof. At this time, encode is applied in each of the phase encode direction and the frequency encode direction in an imaging sequence for detecting the NMR signals, and the NMR signals are detected. In such measurement, an imaging method is known which does not measure a part of regions in either one of the phase encode direction and the frequency encode direction but estimates data of undetected regions by mathematical processing and reconstructs an image. This imaging method is called under the name of a "half Fourier method", a "half scan method" when a part of the undetected regions exists in the phase encode direction or a "half echo method" when a part of the undetected regions exists in the frequency encode direction. Hereinafter, these imaging methods will be generically referred to as the "half imaging method".

The image reconstructed by Fourier transform of the detected data of MRI corresponds to tomograph of the object and is also referred to as the "density distribution". Hereinafter, the image thus reconstructed will be referred to as merely the "reconstructed image". If the reconstructed image is a real number, complex conjugate symmetry is ideally established in the MRI detected data as the Fourier transform of the reconstructed image ("NMR in Medicine", pp. 134–135 (Maruzen, 1991)). In practical MRI, however, this complex conjugate symmetry is no longer established due to inhomogeneity of a static magnetic field, inhomogeneity of a magnetic field induced depending on a permeability distribution of the object and other causes inherent to apparatus characteristics, and the reconstructed image becomes a complex image. Accordingly, a specific calculation method for estimating undetected data becomes necessary in order to obtain excellent reconstructed images in the half imaging method. As this calculation method, "The Journal of the Institute of Electronics, Information and Communication Engineers, Transaction on Communications D", Vol. J71-D, No. 1, pp. 182–187 and "Journal of the Society and Control Engineers", Vol. 30, No. 9, pp. 818–827, and U.S. Pat. Nos. 4,780,675 and 4,912,413 describe a method of obtaining an excellent reconstructed image by estimating phase components of the reconstructed image to obtain a phase map, correcting the detected data by this phase map to obtain complex conjugate symmetry and estimating the undetected data. Furthermore, JP-A-62-8747 discloses another method, but quality of the image obtained by this method is inferior to that of the reconstructed image obtained by the method using the phase map.

SUMMARY OF THE INVENTION

To obtain an excellent reconstructed image in the half imaging method, it is necessary to estimate the phase map and the phase components of the reconstructed image, to perform complex conjugate symmetry processing on the detected data corrected by the phase map or the phase components (phase map correction) and to determine the undetected data. A method which executes phase map correction is also known when the reconstructed image is obtained by performing Fourier transform on the detected data. According to the prior art method for obtaining the reconstructed image in the half imaging method, complicated signal processing including three or more Fourier transforms and filter processing has been necessary, and an extended time has therefore been necessary for this signal processing. Because the half imaging method can reduce the measurement time, it has widely been used for a multi-slice method, or the like, and the problem hereby arises that a long time is necessary for signal processing of a large number of detected data obtained. On the other hand, ultra-high speed imaging is necessary for detecting a distribution change due to metabolism of chemical substances existing in a living body or for inspecting the brain function against a stimulus, and the half imaging method has gained a wide application. However, there remains the problem that a processing time is extended because the image must be reconstructed by processing at a high speed enormous quantities of detected data. Another image reconstruction method according to the prior art separates the detected data, performs Fourier transform on the separated detected data so as to obtain a plurality of images and reconstructs them to obtain the whole image. However, this method is not free from the problem that accuracy of the phase map is not sufficiently high depending on the mode of the separation of the detected data. In consequence, the problem remains unsolved in that artifacts (false images) occur in the whole image.

Hereinafter, the half imaging method (half scan method) according to the prior art will be explained with reference to FIG. 7. This drawing shows the acquired data space (k space) in the conventional half imaging method and the separation method of the detected data in image reconstruction. In FIG. 7, directions of ordinate and abscissa correspond to the phase encode direction and the frequency encode direction, respectively. The whole regions are not covered in the phase encode direction. A region 1 is a detected region in which the NMR signal data are measured, and is separated into regions 3 and 4. A region 2 represents an undetected region in which the NMR signal data are not detected. To reconstruct the whole image, the data of the undetected region 2 must be estimated. When the data belonging to these regions 1, 2, 3, 4 shown in FIG. 4 are expressed by $S_a$, $S_b$, $S_f$, $S_d$, respectively, image reconstruction according to the prior art method uses the following equation (1) or (2) as the fundamental formula. In the following equations, symbol j represents an imaginary number unit, θ is the phase map, exp{} is an exponential function, and exp{2jθ} and exp{jθ} represent the phase components of the reconstructed image.

All the symbols θ, exp{2jθ} and exp{jθ} reflect the phase data of the reconstructed image, and no essential difference exists between them. Therefore, they will be hereinafter called generically the "phase map". To calculate θ, complicated calculation is necessary. Therefore, exp{2jθ} and exp{jθ} are determined and image reconstruction is executed. Incidentally, when the regions 1 and 2 in FIG. 7 are put together, the resultant region becomes the detected region in the case of full scan as an ordinary measurement method which effects measurement throughout the entire regions of the k space.

$$f(x, y) = F^-[S_a + \psi[F[\exp\{2j\theta\} \cdot \{F^{-1}[S_a]\}']]] \quad (1)$$

$$f'(x, y) = \exp\{-j\theta\} \cdot F^{-1}[S_a] + \exp\{-j\theta\} \cdot \{F^{-1}[S_d]\}' \quad (2)$$

Here, f(x, y) and f'(x, y) represent the results of image reconstruction, but no fundamental difference exists between them, and f'(x, y) can be obtained by multiplying exp{jθ} by f(x, y).

Incidentally, symbols F[] and F$^{-1}$[] represent Fourier transform and inverse Fourier transform, respectively, and symbol "'" represents complex conjugate. For example, {F$^{-1}$[S$_a$]}' takes complex conjugate of {F$^{-1}$[S$_a$]} as the result of inverse Fourier transform of the data S$_a$. The same symbol will be used in the following description, too. Symbol ψ in equation (1) means a function to produce data in the undetected region when the known detected data S$_a$ is converted to the original acquired data space by inverse Fourier transform and phase map correction. Therefore, the undetected data S$_b$ is obtained in equation (1). The phase map is obtained from F$^{-1}$[S$_c$] using the detected data S$_c$ at the central portion. As described above, it has been necessary according to the prior art method to perform four times inverse Fourier transform in equation (1) and three times Fourier transform in equation (2). Furthermore, since various filter functions are used, too, the conventional method involves the problem that a long time is necessary for image reconstruction. When image reconstruction is carried out according to this conventional method, the separation method of the detected data shown in FIG. 7 is not suitable, and the problem remains in the method of extracting the detected data S$_c$ in the approximation calculation of the phase map, so that artifacts are likely to occur in the reconstructed image.

It is an object of the present invention to eliminate these problems with the prior art, to reduce the image reconstruction time in the half imaging method, to reduce the artifacts and to improve image quality of the reconstructed image.

According to an aspect of the present invention, there is provided an image reconstruction method in a nuclear magnetic resonance imaging apparatus for reconstructing an intended image of an object under inspection by effecting measurement of nuclear magnetic resonance signals, so as to obtain detected data of a detected region, for at least about a half of a region inclusive of an origin of an acquired data space, at which both of a phase encode and a frequency encode are zero, of the region of either one of a phase encode axis and a frequency encode axis of the acquired data space in which the nuclear magnetic resonance signals from the object are expressed by the phase encode axis and the frequency encode axis, estimating data of the nuclear magnetic resonance signals of undetected regions from the detected data on the basis of complex conjugate symmetry of the detected data, and reconstructing the intended image of the object, the method comprising a first step to get detected data of first and second regions from the detected data, respectively; a second step to get first and second image data by performing Fourier transform on the detected data of the two regions extracted by the first step, respectively; and a third step to synthesize and calculate the first and second image data obtained by the second step. In the first step described above, filtering is made for the detected data extracted, by the use of a filter function, and the filter function is preferably a Hanning function or a Hamming function. Each of the first and second image data may be filtered by the filter function.

In the first step described above, the first region is the whole region of the detected region, and the second region is a part of a region of the detected region having a positional relationship of complex conjugate symmetry with data of the undetected region and is extracted from the detected region symmetrically with respect to a line passing through an origin on one of the axes of the acquired data space, at which encode is zero, and parallel to the other axis. The second step further includes a step to obtain phase data from third image data obtained by performing Fourier transform on the detected data of the third region, a step to obtain a phase map for phase correction from the phase data and the first and second image data, and a sub-step to correct the phase of the second image by the phase map. Further, filter processing is performed on the detected data of each of the first, second and third regions using a filter function.

The positional relationship of complex conjugate symmetry becomes distinct by the use of the position data of the origin of the acquired data space in the half imaging method. Accordingly, the undetected data region which must be obtained in image reconstruction in the half imaging method and the detected data region corresponding to the former can be decided, and an image reconstruction method which is by far simpler than the conventional image reconstruction method can be accomplished. This simple image reconstruction method can accomplish the reduction of the image reconstruction time in the half imaging method. Further, accuracy of the phase map can be improved by improving symmetry of the detected data used for preparing the phase map, and satisfactory image reconstruction can be accomplished.

The present invention can accomplish high speed image reconstruction and high accuracy image reconstruction, that have not been attained in the past, and is particularly effective in MRI technology. Particularly because the present invention can reduce the calculation time necessary for image reconstruction in the half imaging method to about a half of the conventional method, not only the burden to an operator can be reduced but through-put can also be improved, so that the burden to the object under inspection can be reduced.

DESCRIPTION OF THE PREFERRED EMBODIMENTS

The first method according to the present invention comprises the steps of first finding out a region of detected data having a positional relationship of complex conjugate symmetry with a region of undetected data to be determined, from a schematic position of an origin of an acquired data space in-a half imaging method, then subjecting the detected data of the region thus found out to Fourier transform so as to obtain first image data, subjecting all the detected data in the half imaging method to Fourier transform to obtain second image data, and synthesizing these first and second image data to reconstruct the whole image.

The second method of the present invention comprises the steps of extracting detected data near the center of the acquired data space from a schematic position of an origin of an acquired data space in a half imaging method in such a manner that the detected data becomes symmetric with the position of the origin of the acquired data space, subjecting the detected data thus obtained to Fourier transform so as to obtain a phase map, finding out a region of detected data having a positional relationship of complex conjugate symmetry with a region of undetected data to be determined, subjecting the detected data of the region thus found out to Fourier transform and correcting it by the phase map to obtain first image data, subjecting then all the detected data in the half imaging method to Fourier transform to obtain second image data, and synthesizing these first and second data and reconstructing the whole image.

Further, the present invention provides a unique separation method of detected data in a half imaging method in order to extract data with high symmetry from a schematic position of an origin in an acquired data space.

Figure 2:
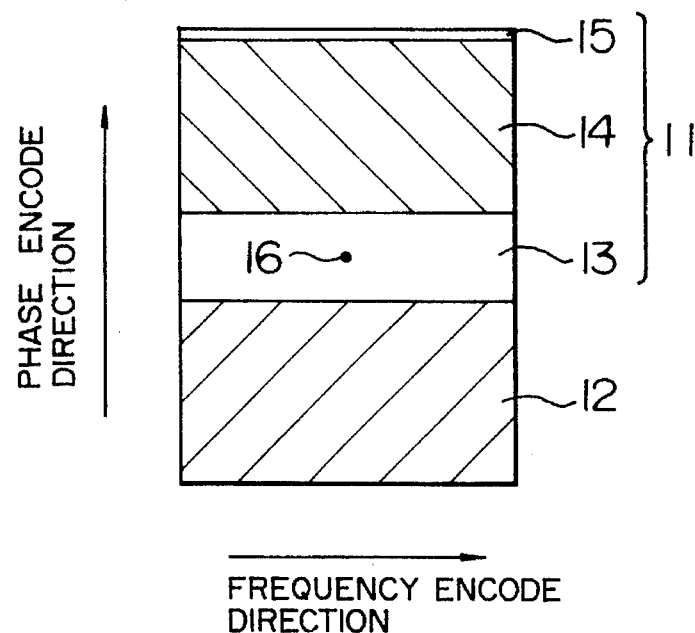
FIG. 2 is a schematic sectional view showing a separation method of detected data in the image reconstruction method according to the present invention.

Hereinafter, an embodiment of the present invention will be described in further detail with reference to the drawings. First, FIG. 2 shows an acquired data space (k space) in the half imaging method in the embodiment of the present invention and a separation method of detected data in image reconstruction. In this embodiment, a region 11 of the whole detected data in the half imaging method is divided into three regions, i.e. a region 13, a region 14 and a region 15. The region 12 represents a region of undetected data, and reference numeral 16 denotes an origin of the acquired data space. The origin 16 of the acquired data space exists at a point at which a phase encode (axis of ordinate) in FIG. 2 and a frequency encode (axis of abscissa), that define two axes of the frequency space as the acquired data space (k space) of MRI, become zero (0). When these two regions 11 and 12 are put together, the resulting region becomes a full scan region. It is known that in an ideal case devoid of any imaginary part in the reconstructed image, a relationship of complex conjugate symmetry is established in two detected data which are symmetric with respect to the origin of the acquired data space.

In image reconstruction by the half imaging method, the position of the origin of the acquired data space plays an extremely important role. The position 16 of the origin of the acquired data space depends on characteristics of a nuclear magnetic resonance imaging apparatus such as an intensity of a gradient magnetic field, a waveform, an application timing, and so forth, and it is possible to determine in advance the schematic position of the origin 16. In FIG. 2, the detected data existing in the region 13 are selected in such a manner that a substantially symmetric positional relationship can be established within the region 13 with the position of the origin 16 of the acquired data space being the center, and the region 14 is selected in such a manner as to satisfy the symmetric positional relationship with the region 12 with respect to a line parallel to the abscissa in FIG. 2 and passing through the origin of the ordinate in FIG. 2, within the acquired data space. As to these selected regions, the region 13 will be hereinafter referred to as a "region per se having a positional relationship of complex conjugate symmetry", and the region 14 will be referred to as a "region having a positional relationship of complex conjugate symmetry with the region 12", for the purpose of simplification. The region 15 represents the outermost detected data among the acquired data space. Here, data belonging to the regions 11, 12, 13, 14 and 15 in FIG. 2 are expressed by $S_I$, $S_{II}$, $S_{III}$, $S_{IV}$ and $S_V$, respectively, and one of the fundamental formulas used for image reconstruction in the present invention is given by equation (3):

$$f(x, y)=F^{-1}[S_I]+[\{F^{-1}[S_I]-F^{-1}[S_{IV}]\}/\{F^{-1}[S_I]-F^{-1}[S_{IV}]\}']\cdot\{F^{-1}[S_{IV}]\}' \quad (3)$$

For simplification purposes, equation (3) may be expressed as equation (3') as follows:

$$f(x, y)=F1+[(F1-F2)/(F1-F2')]\cdot F3 \quad (3')$$

Figure 1:
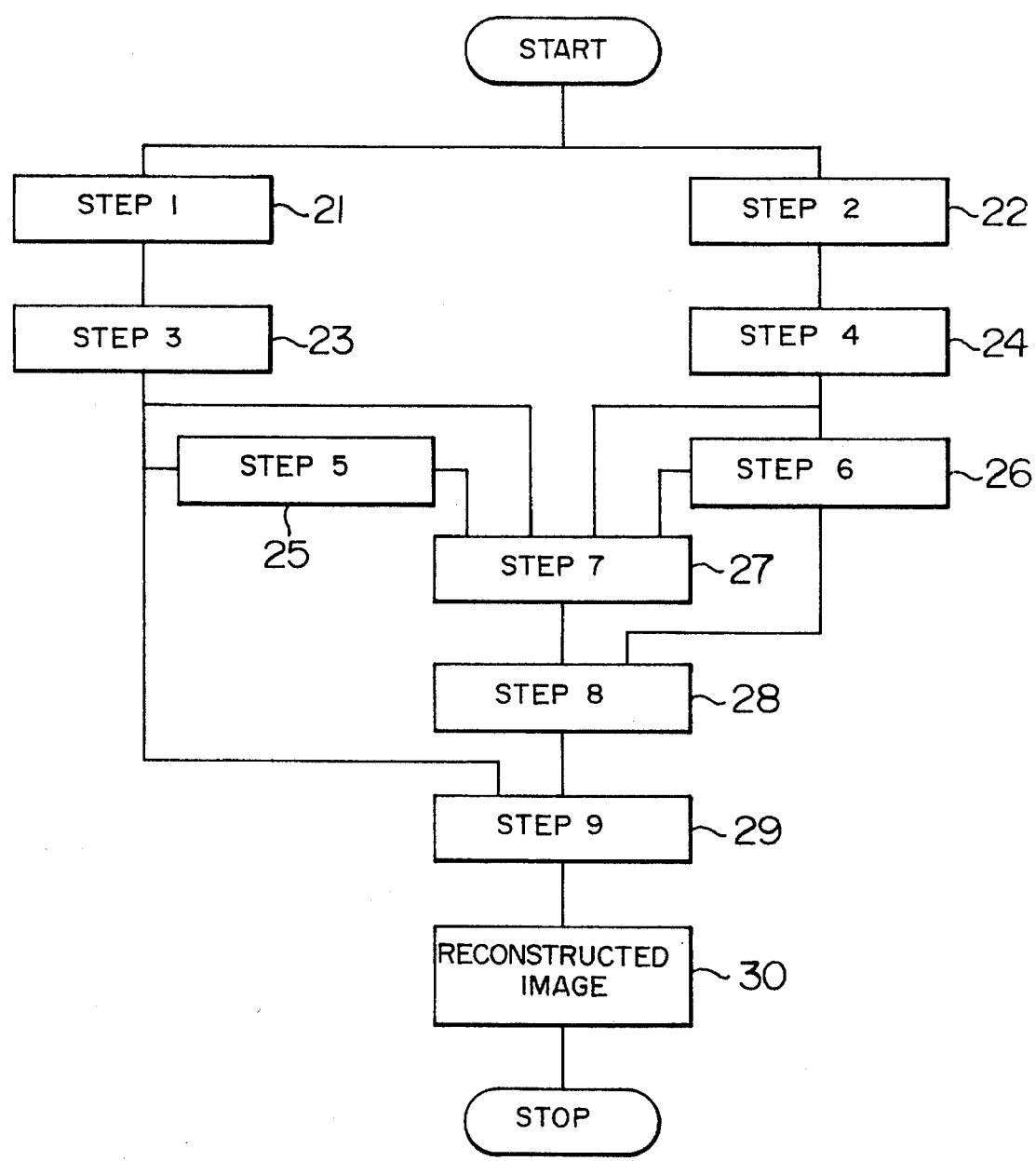
FIG. 1 is a flowchart showing the procedures of processing of an image reconstruction method according to the present invention.

FIG. 1 shows the flowchart representing the procedures of processing on the basis of equation (3) of the detected data by the half imaging method. The processing steps include Steps 1 and 2 (reference numerals 21 and 22) to get the data $S_I$ and $S_{IV}$ from the detected data, respectively, Steps 3 and 4 (reference numerals 23 and 24) to perform inverse Fourier transform on the data $S_I$ and $S_{IV}$, respectively, a Step 5 (reference numeral 25) to calculate complex conjugates of the results of inverse Fourier transform from Step 3 (23), a Step 6 (reference numeral 26) to calculate complex conjugates of the results of inverse Fourier transform from Step 4 (24), a Step 7 (reference numeral 27) to calculate a phase map for correcting the phase from the result of inverse Fourier transform obtained from Step 3 (23), the result of inverse Fourier transform obtained from Step 4 (24), the result of the complex conjugates obtained from Step 5 (25) and the result of the complex conjugates obtained from Step 6 (26), a Step 8 (reference numeral 28) to multiply the complex conjugates obtained from Step 6 (26) by the phase map obtained from Step 7 (27) and to obtain a phase-corrected data for the complex conjugates obtained from Step 6 (26), and a Step 9 (reference numeral 29) to sum (synthesize) the result of inverse Fourier transform obtained from Step 3 (23) and the phase-corrected data of the complex conjugate value of Step 6 (26) obtained from Step 8 (28), and when these steps are executed, the overall reconstructed image (reference numeral 30) can be obtained. Incidentally, the phase map for correcting the phase at Step 7 (reference numeral 27) is a coefficient which is multiplied by the second term $\{F^{-1}[S_{IV}]\}'$ on the right side of equation (3). As described above, according to equation (3), image reconstruction can be made by executing only twice inverse Fourier transform in the half imaging method, and the calculation time can be drastically reduced to the half of the calculation time in image reconstruction in the conventional half imaging method.

Incidentally, in extraction and inverse Fourier transform of data $S_I$ and data $S_{IV}$ at Step 1 (reference numeral 21), Step 2 (reference numeral 22), Step 3 (reference numeral 23) and Step 4 (reference numeral 24), the operation of inserting 0 may be effected for the regions other than the region of detected data which are extracted. However, when artifacts such as ringing are likely to occur, filtering processing such as Hanning filter or Hamming filter may be applied to extract the detected data. Separation of the detected data in this case need not have a strict positional relationship of complex conjugate symmetry such as the one shown in FIG. 2. For example, the region 14 and the region 13 may somewhat overlap with each other or the region 11 and the region 12 may somewhat overlap with each other. The filter function may also be used at Step 9 (reference numeral 29).

Figure 3:
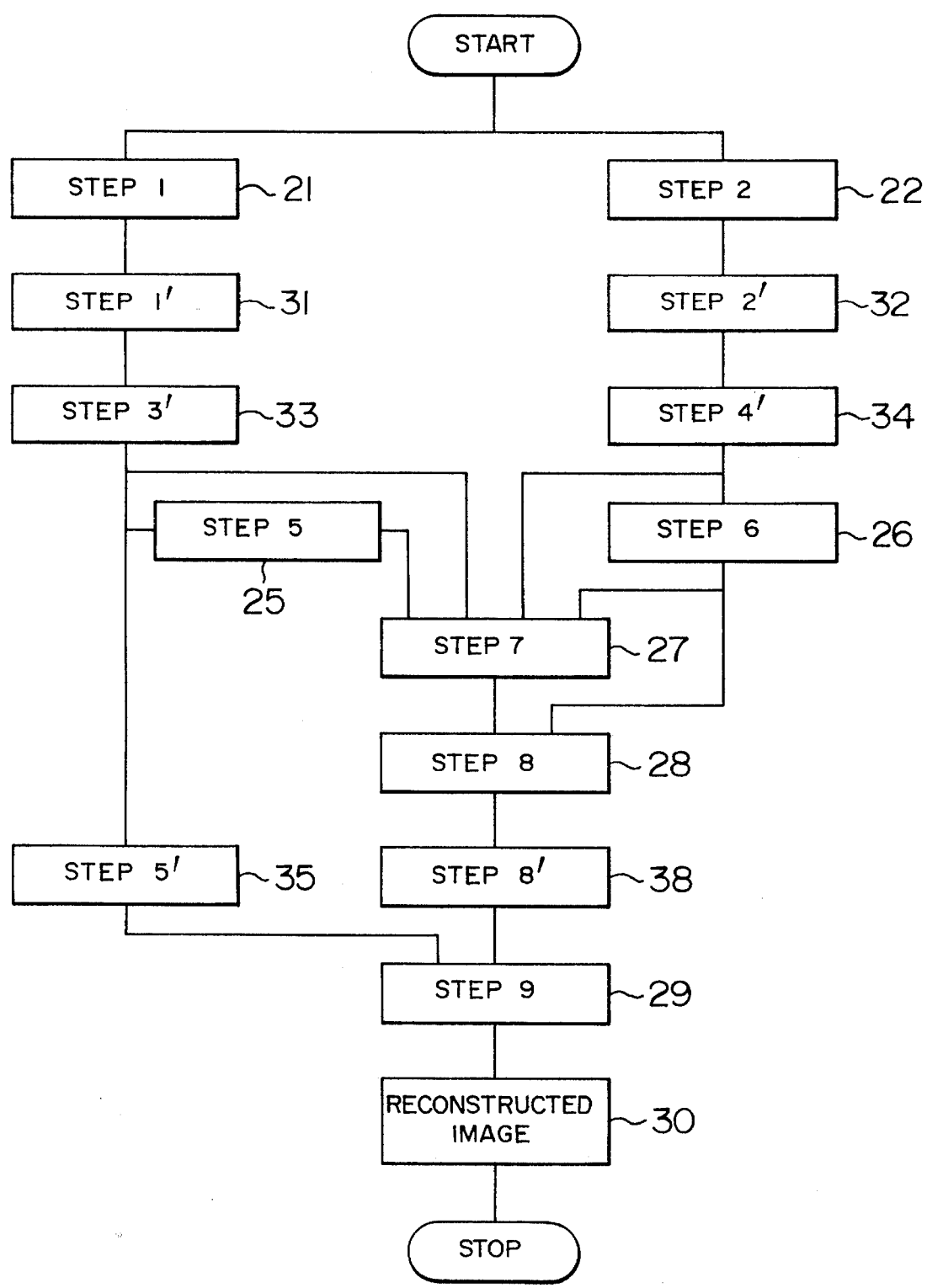
FIG. 3 is a flowchart showing the procedures of processing of another image reconstruction method according to the present invention.

FIG. 3 shows a flowchart representing the procedures of processing including these two filter processings. The processing steps include Step 1 (reference numeral 21) and Step 2 (reference numeral 22) to get the data $S_I$ and the data $S_{IV}$ from the detected total data, respectively, Step 1' (reference numeral 31) and Step 2' (reference numeral 32) to perform filtering of the data $S_I$ and $S_{IV}$ from Steps 1 and 2, Step 3' (reference numeral 33) and Step 4' (reference numeral 34) to perform inverse Fourier transform on the filtering results of Steps 1' and 2' (reference numerals 31, 32), respectively, Step 5 (reference numeral 25) to calculate the complex conjugates on the result of inverse Fourier transform from Step 3' (reference numeral 33), Step 6 to calculate the complex conjugates on the result of inverse Fourier transform from Step 4' (reference numeral 34), Step 7 (reference numeral 27) to calculate the phase map for correcting the phase from the result of inverse Fourier transform at Step 3' (reference numeral 33), from the result of inverse Fourier transform at Step 4' (reference numeral 34), from the result of the complex conjugates obtained at Step 5 (reference numeral 25) and from the result of the complex conjugates obtained at Step 6 (reference numeral 26), Step 8 (reference numeral 28) to multiply the complex conjugates obtained at Step 6 (reference numeral 26) by the phase map obtained at Step 7 (reference numeral 27) and to obtain the phase-corrected data of the complex conjugates obtained at Step 6 (reference numeral 26), Step 5' (reference numeral 35) to perform filtering of the result of inverse Fourier transform obtained at Step 3' (reference numeral 33), Step 8' (reference numeral 38) to perform filtering of the phase-corrected complex conjugates of Step 6 (reference numeral 26) obtained at Step 8 (reference numeral 28), and Step 9 (reference numeral 29) to sum (synthesize) the result of Step 5' and the result of Step 8' (reference numeral 38). The overall reconstructed image (reference numeral 30) can be obtained by these Steps. It is of course possible to perform either one of the two filtering processings (or to delete Steps 1' and 2' or Steps 5' and 8').

Image reconstruction of the detected data of the human head is carried out practically by the half imaging method in accordance with equation (3) and the reconstructed image is compared with the reconstructed image obtained by the conventional method. As a result, the image reconstructed in according with equation (3) is better at the profile of the head and in the periphery of the blood vessels that the image by the conventional method. The calculation time by the image reconstruction method in accordance with equation (3) is about a half of the conventional image reconstruction method. It has thus been confirmed that the method of the present invention is effective particularly for a multi-slice method for reconstructing a large number of images. The explanation of equation (3) with reference to FIGS. 1 and 3 has been given primarily on the case where the image reconstruction is effected by performing two dimensional inverse Fourier transform of the detected data. In the half imaging method, however, regions of undetected data exist either in the direction of phase encode or in the direction of frequency encode, and the detected data is sometimes insufficient to reconstruct the whole image. The direction in which the undetected data (that is, the data $S_{II}$ in equation (3)) exists will be hereinafter referred to as the "half direction". It is possible to perform in advance Fourier transform in the directions other than this half direction. Accordingly, it is possible to execute image reconstruction in accordance with equation (3) and FIGS. 1 and 3 on the data for which Fourier transform is in advance made in the directions other than in the half direction. In this case, inverse Fourier transform in equation (3) and in FIGS. 1 and 3 corresponds to one-dimensional Fourier transform in only the half direction.

Division of the detected data shown in FIG. 2 need not be determined so strictly when the number of detected data is great. It has been found out that when an image is reconstructed by strictly effecting separation of the detected data shown in FIG. 2 and the resulting image is compared with the image reconstructed by the calculation method of equation (3) by regarding the region 5 (data $S_V$) as being absent in FIG. 2, the reconstructed images having equal image quality can be obtained in some cases. As described above, modifications can be made to a certain extent in the separation of the detected data when image reconstruction of equation (3) is applied. However, separation of the detected data is preferably carried out strictly to a certain extent, otherwise the attention must be paid to the fact that artifacts exist, though not noticeable.

Next, another fundamental equation which can be used in image reconstruction providing an equivalent result to equation (3) is given by equation (4). According to this equation (4), a reconstructed image can be obtained in the same way as the method using equation (3).

$$f(x, y)=F^{-1}[S_{IV}]+\{[F^{-1}[S_I]-F^{-1}[S_{IV}]\} /\{F^{-1}[S_I]-F^{-1}[S_{IV}]\}\}\cdot\{F^{-1}[S_I]\}' \quad (4)$$

For simplification purposes, equation (4) may be expressed as equation (4') as follows $$f(x, y)=F2+[(F1-F2)/(F1-F2')]\cdot F4 \quad (4')$$

Still another fundamental equation capable of being used in image reconstruction is given by equation (5). The term $\exp\{2j\theta\}$ in equation (5) is calculated from $F^{-1}[S_{III}]$.

$$f(x, y)=F^{-1}[S_I]+\exp\{2j\theta\}\cdot\{F^{-1}[S_{IV}]\}' \quad (5)$$

For simplification purposes, equation (5) may be expressed as equation (5)' as follows:

$$f(x, y)=F1+F5F2' \quad (5')$$

The difference between equation (5) and equation (2) resides in the mode of separation of the detected data. According to the image reconstruction methods using the equations (3), (4) and (5) as the fundamental equations of the present invention, reconstructed image having substantially equal image quality can be obtained, but the calculation time necessary for image reconstruction becomes shorter when equations (3) and (4) are used.

Next, in order to clarify the problem in the conventional data separation method of the detected data, the results of image reconstruction by the separation method of the detected data according to the present invention and by the conventional separation method are compared with one another. Image reconstruction having a pixel size of 32×32 is carried out using a numerical simulation method of MRI (Autumn National Convention Record of the IEIEC) by each method for comparison. A gradient echo (GE) method as a typical example of the MRI imaging methods (for further detail, refer to "NMR in Medicine", pp. 136–138, Maruzen (1991) is used as a model of this numerical simulation. The model of the reconstructed image is shown in FIG. 4.

Figure 4:
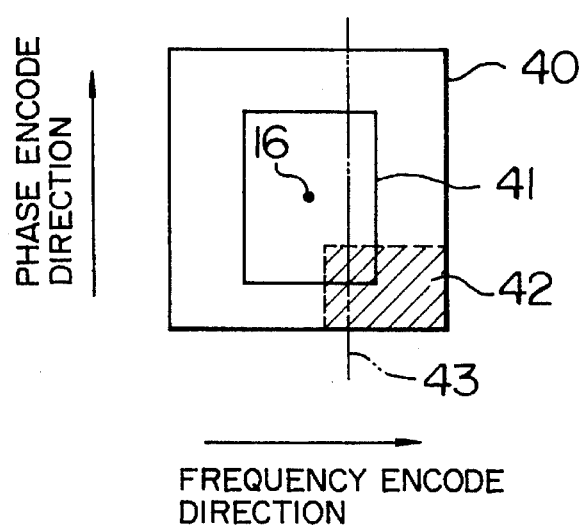
FIG. 4 is a schematic model view showing a model of a reconstructed image used for numerical simulation in order to compare the present invention with a prior art method.

In FIG. 4, a square uniform object under inspection (object) 41 exists near the center of an image region 40 so be reconstructed, which has a pixel size of 32×32, and a region 42 in an inhomogeneous static magnetic field of 10 ppm (indicated by oblique lines) exists in a lower region of the image region 40. In this numerical simulation, the phase encode direction exists in the half direction, the total number of phase encodes is 32 (a serial number is allocated from above in the phase encode direction to obtain the phase encodes Nos. 1 to 32) in the case of full scan (ordinary measurement method where all the measurements are carried out in the k space), and the half imaging method is considered where the total number of the phase encodes is 22 (assuming that the measurement is carried out only in the phase encodes Nos. 1 to 22 of the case of full scan; a data usage ratio in this case is about 69% of the case of full scan). The position of the origin 16 in the acquired data space in this case is assumed to exist on the line of the phase encode No. 17.

Figure 5A:
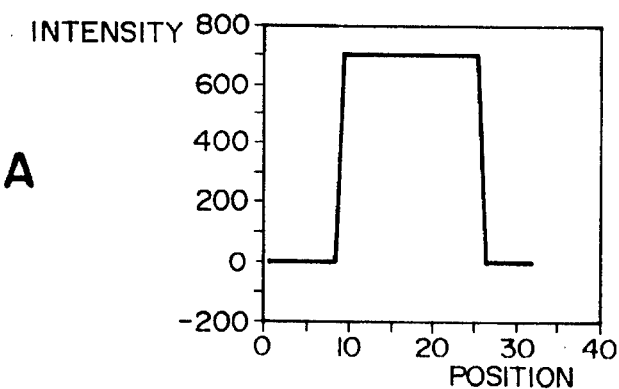
FIGS. 5A to 5H are diagrams each showing the result of numerical simulation for comparing the present invention with the prior art method.
Figure 5B:
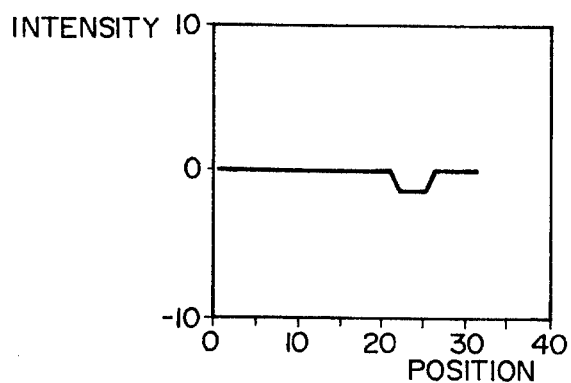

Evaluation of the reconstructed image is made by comparing the values of the real and imaginary parts of the image reconstruction values on the dotted line 43 shown in FIG. 4 with the standard deviation of the absolute value of each pixel at the center of the reconstructed image having a pixel size of 7×7. Here, equation (1) is used as the conventional method for comparison. FIGS. 5A, 5C, 5E and 5G show the profiles of the real parts of the image reconstructed values on the dotted line 43 shown in FIG. 4, whereas FIGS. 5B, 5D, 5F and 5H show the profiles of the values of the imaginary parts of the image reconsted values on the dotted line 43 shown in FIG. 4. FIGS. 5A and 5B show the real and imaginary parts of the image reconstructed values by full scan, respectively, and they are used as the reference for comparison. In other words, the profiles approximate to FIGS. 5A and 5B represent better results. In contrast, the profile shown in FIGS. 5C, 5D, 5E and 5F are obtained by performing the image reconstruction by the half imaging method according to equation (1).

Figure 5C:
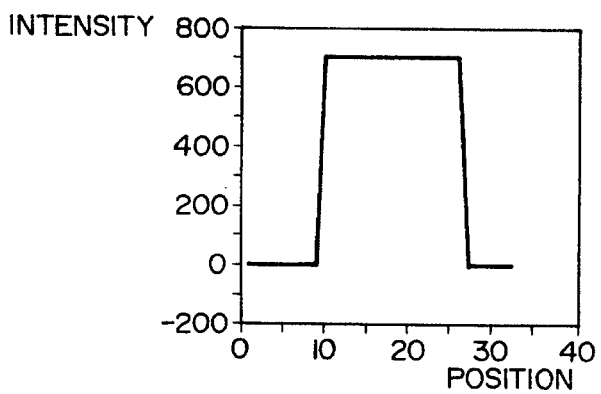
Figure 5D:
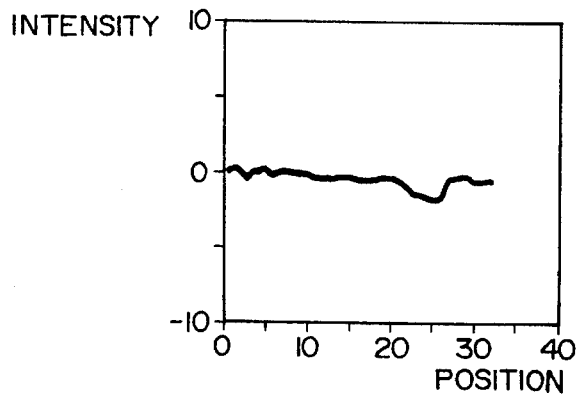

The profiles shown in FIGS. 5C and 5D are obtained from the results of image reconstruction using the detected data of the phase encodes Nos. 12 to 22 as the data $S_c$, calculating $\exp\{2j\theta\}$ in equation (1) from $F^{-1}[S_c]$ and using the phase encodes Nos. 1 to 22 as the data $S_a$.

The profiles shown in 5E and 5F are obtained from the results of image reconstruction using the detected data of the phase encodes Nos. 11 to 22 as the data $S_c$, calculating $\exp\{2j\theta\}$ in equation (1) from $F^{-1}[S_c]$, and using the detected data of the phase encodes Nos. 1 to 22 as the data $S_a$.

Figure 5E:
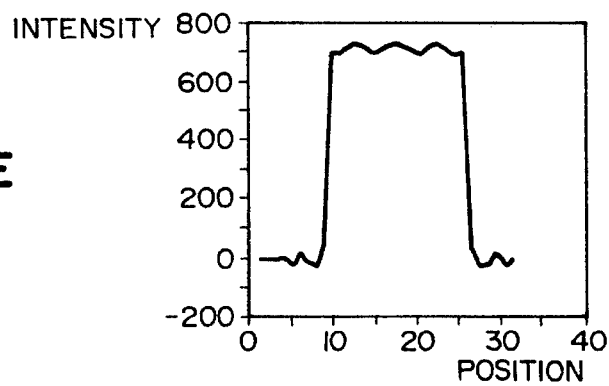
Figure 5F:
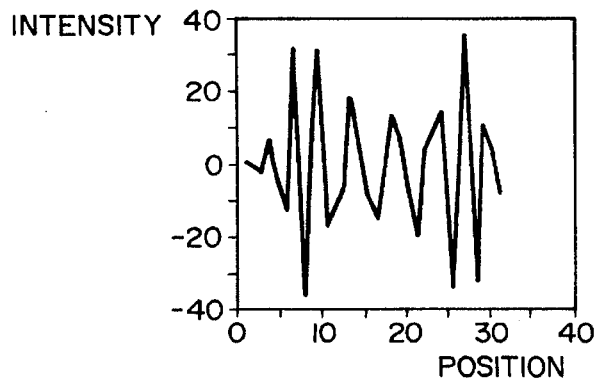

When FIGS. 5C, 5D, 5E and 5F are compared with FIGS. 5A and 5B, it can be understood that FIGS. 5C and 5D provide the better results than FIGS. 5E and 5F.

Although accuracy of the phase map ($\exp\{2j\theta\}$) becomes higher in the calculation of image reconstruction for obtaining FIGS. 5E and 5F because the number of data used in the calculation of the phase map is great, the balance of the data used gets deteriorated, on the contrary, so that accuracy of the phase map as well as image quality drop. It can be thus appreciated that in the half imaging method, separation of the data plays an extremely important role. According to the prior art methods, separation of the detected data is effected while almost neglecting the position of the origin of the acquired data space and consequently, accuracy of the phase map is low. In some cases, artifacts occur as in the example shown in FIGS. 5E and 5F.

Figure 5G:
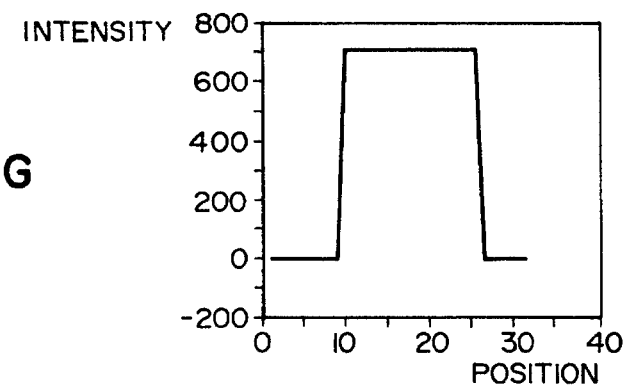
Figure 5H:
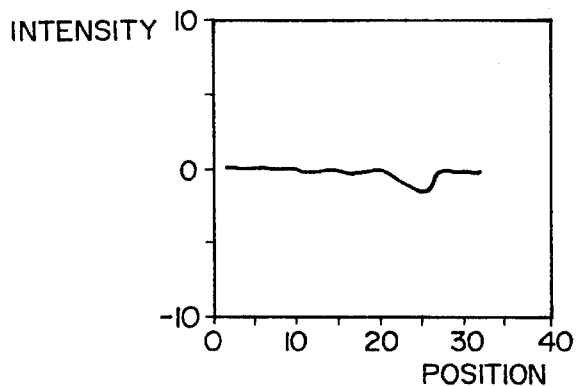

FIGS. 5G and 5H show examples of the profiles obtained by effecting separation of the detected data in the present invention shown in FIG. 2 and performing image reconstruction in accordance with equation (3). Incidentally, a region of data $S_{III}$ is assumed to be the regions of the phase encodes Nos. 12 to 22. It can be understood that the results shown in FIGS. 5G and 5H substantially agree with the results shown in FIGS. 5C and 5D.

TABLE 1

| Condition | 1 | 2 | 3 | 4 |
|---|---|---|---|---|
| Standard deviation | 0.141 | 0.141 | 10.2 | 0.142 |

Table 1 tabulates the standard deviation of each pixel at the center of the reconstructed absolute value image having a pixel size of 7×7. The condition 1 corresponds to FIGS. 5A and 5B, condition 2 does to FIGS. 5C and 5D, condition 3 does to FIGS. 5E and 5F, and condition 4 does to FIGS. 5G and 5H. The center portion of the reconstructed image corresponds to the uniform object 41 at the center shown in FIG. 4, and the smaller the standard deviation, the better becomes the result. The values of the standard deviation correspond to the results of FIGS. 5A to 5H.

When image reconstruction is performed in accordance with equations (4) and (5) by effecting separation of the detected data shown in FIG. 2, substantially the same image reconstruction value as that of the case of equation (3) can be obtained. The calculation time is the shortest when equations (3) and (4) are used, and the time in this case is about a half of the calculation time of the conventional method using equation (1). Handling of the data $S_v$ belonging to the region 15 shown in FIG. 2 (the detected data of the region corresponding to the phase encode No. 1 in the example shown in FIG. 4) is also very important. When this data $S_v$ is neglected, deterioration of the reconstructed image occurs, and equation (2) in which the data $S_v$ does not fundamentally exist involves the problem of deterioration of the reconstructed image. In equation (1), the data $S_v$ shown in FIG. 2 need not be taken into account, but inverse Fourier transform becomes excessively necessary as much. Therefore, the problem exists in that the calculation time becomes longer.

In the explanation given above, numerical simulation is carried out for a small model of a pixel size of 32×32 in order to clarify the problems encountered in the separation of the detected data. In a practical MRI apparatus, image reconstruction is carried out for a pixel size of 256×256 or a pixel size of 512×512. In such a case, the weight of one encode becomes smaller, and the problem of the separation of the detected data does not become so clear. However, separation of the detected data is preferably carried out strictly to a certain extent, unless otherwise the artifacts exist, though not much noticeably. As described above, the separation method of the detected data according to the present invention shown in FIG. 2 is found effective in order to improve image quality of the reconstructed image by the half imaging method.

Though the explanation given above primarily deals with the case where the half direction exists in the phase encode direction, the present invention can of course be applied to the case where the half direction exists in the frequency encode direction.

Figure 6:
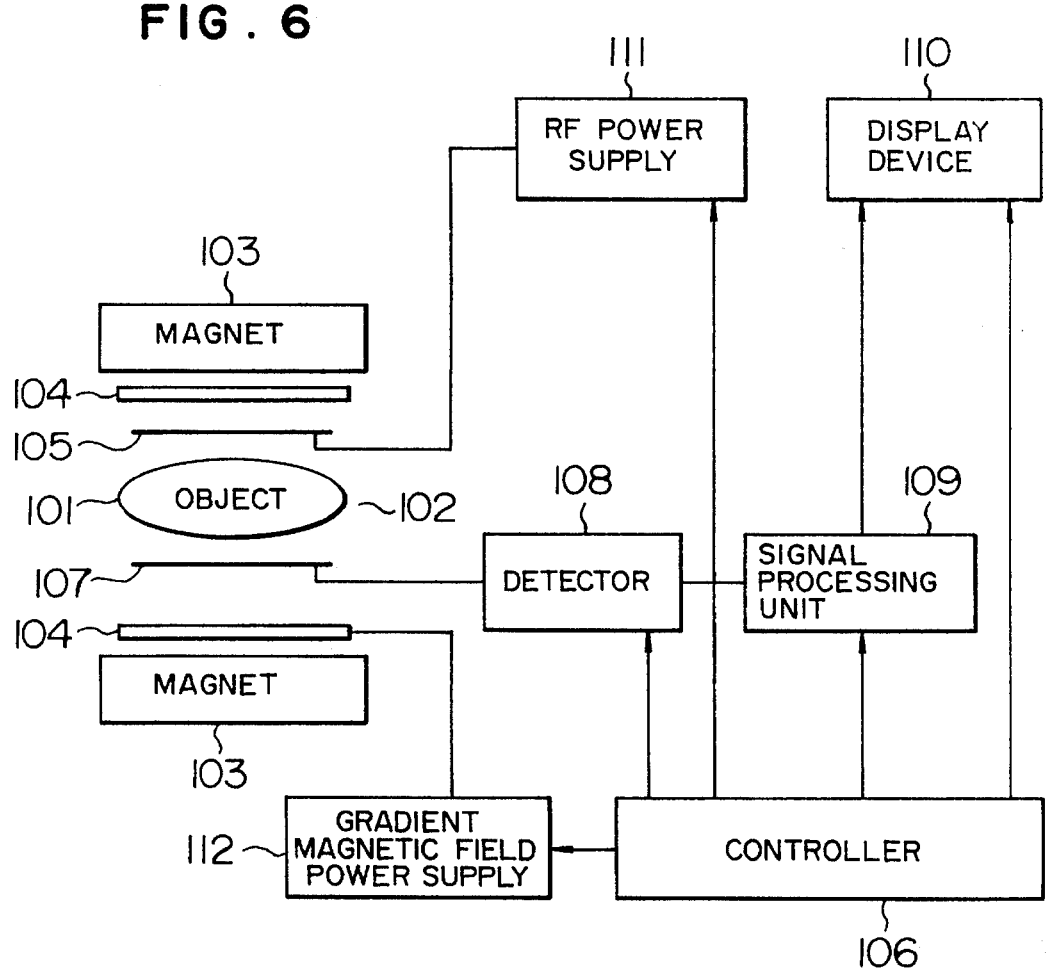
FIG. 6 is a block diagram showing the overall construction of an apparatus to which the present invention is applied.
Figure 7:
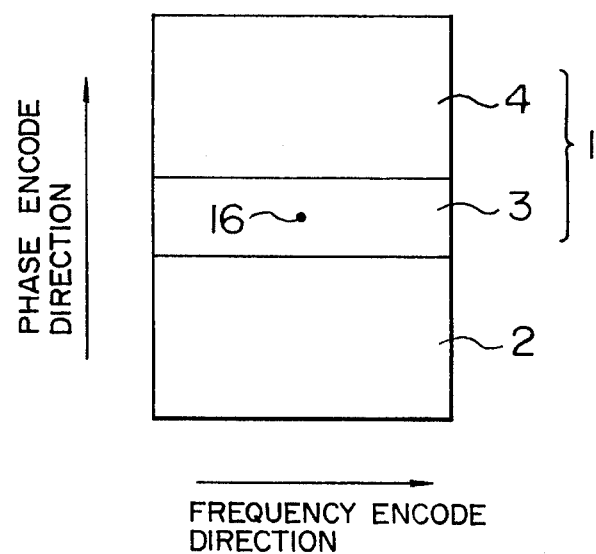
FIG. 7 is a schematic view showing a separation method of measurement data in an image reconstruction method according to the prior art.

Next, FIG. 6 shows the overall construction of a nuclear magnetic resonance imaging apparatus (MRI) to which the present invention is applied. This MRI apparatus comprises a magnet 103 for generating a static magnetic field in a space 102 occupied by an object 101, a gradient magnetic field coil 104 for generating a gradient magnetic field in the space 102, an RF probe 105 for generating a radio frequency (RF) magnetic field in the space 102, a gradient magnetic field coil 104 for generating a gradient magnetic field in the space 102, an RF probe 105 for generating an RF magnetic field in the space 102, an RF probe 107 for detecting an MR signal generated by the object 101, a detector 108 for detecting a signal of the RF probe 107, a signal processing unit 109 for processing the detected signal and converting it to an image signal, a display device 110 for displaying an image on the basis of the image signal, and a controller 106 for controlling an RF power supply 111, a gradient magnetic field power supply 112, the detector 108, the signal processing unit 109 and the display device 110.

The magnet 103 generates a strong and homogeneous magnetic field around the object 101, and a typical magnetic field intensity is from 0.1T to 4.7T. A super-conductive magnet or a permanent magnet is used for this magnet 103. The output of the RF power supply 111 controlled by the controller 106 is sent to the RF coil 105, and the RF coil 105 generates an RF magnetic field having a frequency of 4 to 200 MHz. The output of the gradient magnetic field power supply 112 is controlled by the controller 106, and the gradient magnetic field coil 104 generates gradient magnetic fields Gx, Gy and Gz in three directions of X, Y and Z. An intended slice plane can be set to the object 101 by the mode of application of the gradient magnetic fields. The detector 108 detects the signal of the RF coil 107. The output of the detector 108 is subjected to processing such as Fourier transform, image reconstruction, etc., by the signal processing unit 109, and the result of this processing is displayed by the display device 110. A typical sequence of measurement process includes a spin echo sequence, a gradient echo sequence, an echo planar sequence, etc. When the method of the present invention is applied to such an apparatus, image reconstruction can be carried out at a high speed by the half imaging method. Accordingly, a multi-slice MR image, for example, can be acquired by the echo planar sequence using the half imaging method, and the living brain function, etc., can be measured at a high speed and can be displayed as the image.

We claim:

1. An image reconstruction method in a nuclear magnetic resonance imaging apparatus for reconstructing an intended image of an object under inspection by effecting measurement of nuclear magnetic resonance signals, so as to obtain detected data of a detected region, for at least about a half of a region inclusive of an origin of an acquired data space, at which both of a phase encode and a frequency encode are zero, of said region of either one of a phase encode axis and a frequency encode axis of said acquired data space in which the nuclear magnetic resonance signals from said object are expressed by said phase encode axis and said frequency encode axis, estimating data of the nuclear magnetic resonance signals of undetected regions from said detected data on the basis of complex conjugate symmetry of said detected data, and reconstructing the intended image of said object, said method comprising:

a first step to get, from said detected data, a first region comprising the whole region of said detected region and a second region as a part of said detected region having a positional relationship of complex conjugate symmetry with data of said undetected region, and symmetric with a line passing through an origin on one of said axes of said acquired data space, at which encode is zero, and parallel to the other of said axes;

a second step to get Fourier transforms F1 and F2 of the detected data of said first and second regions, respectively;

a third step to get a complex conjugate value F3 of said Fourier transform F2; and a fourth step to sum said Fourier transform F1 and the product obtained by multiplying said complex conjugate value F3 by the quotient obtained by dividing the difference between said Fourier transform F1 and said Fourier transform F2 by the complex conjugate value of the difference between said Fourier transform F1 and said Fourier transform F2; for thereby obtaining the image of said object.

2. An image reconstruction method in a nuclear magnetic resonance imaging apparatus according to claim 1, wherein said first step further includes a sub-step to perform filtering of the detected data of said first and second regions by a filter function.

3. An image reconstruction method in a nuclear magnetic resonance imaging apparatus according to claim 2, wherein said filter function is either a Hanning filter or a Hamming filter.

4. An image reconstruction method in a nuclear magnetic resonance imaging apparatus for reconstructing an intended image of an object under inspection by effecting measurement of nuclear magnetic resonance signals, so as to obtain detected data of a detected region, for at least about a half of a region inclusive of an origin of an acquired data space, at which both of a phase encode and a frequency encode are zero, of said region of either one of a phase encode axis and a frequency encode axis of said acquired data space in which the nuclear magnetic resonance signals from said object are expressed by said phase encode axis and said frequency encode axis, estimating data of the nuclear magnetic resonance signals of undetected regions from said detected data on the basis of complex conjugate symmetry of said detected data, and reconstructing the intended image of said object, said method comprising:

a first step to get, from said detected data, a first region comprising the whole region of said detected region and a second region as a part of said detected region having a positional relationship of complex conjugate symmetry with data of said undetected region, and symmetric with a line passing through an origin on one of said axes of said acquired data space, at which encode is zero, and parallel to the other of said axes;

a second step to get Fourier transforms F1 and F2 of the detected data of said first and second regions, respectively;

a third step to get a complex conjugate value F4 of said Fourier transform F1; and a fourth step to sum said Fourier transform F2 and the product obtained by multiplying said complex conjugate value F4 by the quotient obtained by dividing the difference between said Fourier transform F1 and said Fourier transform F2 by the complex conjugate value of the difference between said Fourier transform F1 and said Fourier transform F2; for thereby obtaining the image of said object.

5. An image reconstruction method in a nuclear magnetic resonance imaging apparatus according to claim 4, wherein said first step further includes a sub-step to perform filtering of the detected data of said first and second regions by a filter function.

6. An image reconstruction method in a nuclear magnetic resonance imaging apparatus according to claim 5, wherein said filter function is either a Hanning filter or a Hamming filter.

7. An image reconstruction method in a nuclear magnetic resonance imaging apparatus for reconstructing an intended image of an object under inspection by effecting measurement of nuclear magnetic resonance signals, so as to obtain detected data of a detected region, for at least about a half of a region inclusive of an origin of an acquired data space, at which both of a phase encode and a frequency encode are zero, of said region of either one of a phase encode axis and a frequency encode axis of said acquired data space in which the nuclear magnetic resonance signals from said object are expressed by said phase encode axis and said frequency encode axis, estimating data of the nuclear magnetic resonance signals of undetected regions from said detected data on the basis of complex conjugate symmetry of said detected data, and reconstructing the intended image of said object, said method comprising:

a first step to get, from said detected data, a first region comprising the whole region of said detected region, a second region as a part of said detected region having a positional relationship of complex conjugate symmetry with data of said undetected region, and symmetric with a line passing through an origin on one of said axes of said acquired data space, at which encode is zero, and parallel to the other of said axes, and a third region symmetric with respect to a substantial position of said origin inclusive of said origin as the center;

a second step to obtain Fourier transforms F1, F2 and F5 of the detected data of said first, second and third regions, respectively; and a third step to sum said Fourier transform F1 and the product of the complex conjugate values of said Fourier transforms F2 and F5; for thereby obtaining the image of said object.

8. An image reconstruction method in a nuclear magnetic resonance imaging apparatus according to claim 7, wherein the size of said first region in said first step is greater than the sum of the sizes of said second and third regions.

9. An image reconstruction method in a nuclear magnetic resonance imaging apparatus according to claim 7, wherein said first step further includes a sub-step to perform filtering of the detected data of said first and second regions by a filter function.

10. An image reconstruction method in a nuclear magnetic resonance imaging apparatus according to claim 9, wherein said filter function is either a Hanning function or a Hamming function.

11. An image reconstruction method in a nuclear magnetic resonance imaging apparatus for reconstructing an intended image of an object under inspection by effecting measurement of nuclear magnetic resonance signals, so as to obtain detected data of a detected region, for at least about a half of a region inclusive of an origin of an acquired data space, at which both of a phase encode and a frequency encode are zero, of said region of either one of a phase encode axis and a frequency encode axis of said acquired data space in which the nuclear magnetic resonance signals from said object are expressed by said phase encode axis and said frequency encode axis, estimating data of the nuclear magnetic resonance signals of undetected regions from said detected data on the basis of complex conjugate symmetry of said detected data, and reconstructing the intended image of said object, said method comprising:

a first step to get, from said detected data, a first region comprising the whole region of said detected region and a second region as a part of said detected region having a positional relationship of complex conjugate symmetry with data of said undetected region, and symmetric with a line passing through an origin in one of said axes of said acquired data space, at which encode is zero, and parallel to the other of said axes;

a second step to get Fourier transforms F1 and F2 of the detected data of said first and second regions, respectively;

a third step to calculate a phase map for phase correction from said Fourier transform F1 and F2;

a fourth step get a complex conjugate value F3 of said Fourier transform F2; and a fifth step to sum said Fourier transform F1 and said complex conjugate value F3 which has been phase corrected by said phase map, for thereby obtaining the image of said object.

12. An image reconstruction method in a nuclear magnetic resonance imaging apparatus for reconstructing an intended image of an object under inspection by effecting measurement of nuclear magnetic resonance signals, so as to obtain detected data of a detected region, for at least about a half of a region inclusive of an origin of an acquired data space, at which both of a phase encode and a frequency encode are zero, of said region of either one of a phase encode axis and a frequency encode axis of said acquired data space in which the nuclear magnetic resonance signals from said object are expressed by said phase encode axis and said frequency encode axis, estimating data of the nuclear magnetic resonance signals of undetected regions from said detected data on the basis of complex conjugate symmetry of said detected data, and reconstructing the intended image of said object, said method comprising:

a first step to get, from said detected data, a first region comprising the whole region of said detected region and a second region as a part of said detected region having a positional relationship of complex conjugate symmetry with data of said undetected region, and symmetric with a line passing through an origin in one of said axes of said acquired data space, at which encode is zero, and parallel to the other of said axes;

a second step to get Fourier transforms F1 and F2 of the detected data of said first and second regions, respectively;

a third step to calculate a phase map for phase correction from said Fourier transform F1 and F2;

a fourth step get a complex conjugate value F4 of said Fourier transform F1; and a fifth step to sum said Fourier transform F2 and said complex conjugate value F4 which has been phase corrected by said phase map, for thereby obtaining the image of said object.

* * * * *